United States Patent [19]
Wu

[11] Patent Number: 6,091,100
[45] Date of Patent: Jul. 18, 2000

[54] HIGH DENSITY NAND STRUCTURE NONVOLATILE MEMORIES

[75] Inventor: Shye-Lin Wu, Hsinchu, Taiwan

[73] Assignee: Texas Instruments - Acer Incorporated, Hsinchu, Taiwan

[21] Appl. No.: 09/020,230

[22] Filed: Feb. 6, 1998

[51] Int. Cl.[7] .................................................. H01L 29/792
[52] U.S. Cl. .......................... 257/315; 257/316; 257/321; 257/324; 257/325
[58] Field of Search .................................... 257/316, 324, 257/325, 315, 321

[56] References Cited

U.S. PATENT DOCUMENTS

| | | | |
|---|---|---|---|
| 5,032,881 | 7/1991 | Sardo et al. ............................ | 357/23.5 |
| 5,053,840 | 10/1991 | Yoshikawa ............................... | 357/23.5 |
| 5,306,935 | 4/1994 | Esquivel et al. ......................... | 257/315 |
| 5,541,130 | 7/1996 | Oguva et al. ............................. | 437/43 |
| 5,841,162 | 11/1998 | Enomoto .................................. | 257/315 |

*Primary Examiner*—William Mintel
*Attorney, Agent, or Firm*—Harness, Dickey & Pierce, P.L.C.

[57] ABSTRACT

The present invention includes pad oxides that are separated from each other and on a substrate. First isolations are formed on the pad oxides. Second isolations are formed on the substrate, between the pad oxides. Floating gates are formed on the second isolations and between the first isolations. Third isolations are formed at the top of the floating gates. A word line is formed on the first isolations and on the third isolations. Bit lines are formed in the substrate and under the first isolations.

20 Claims, 5 Drawing Sheets

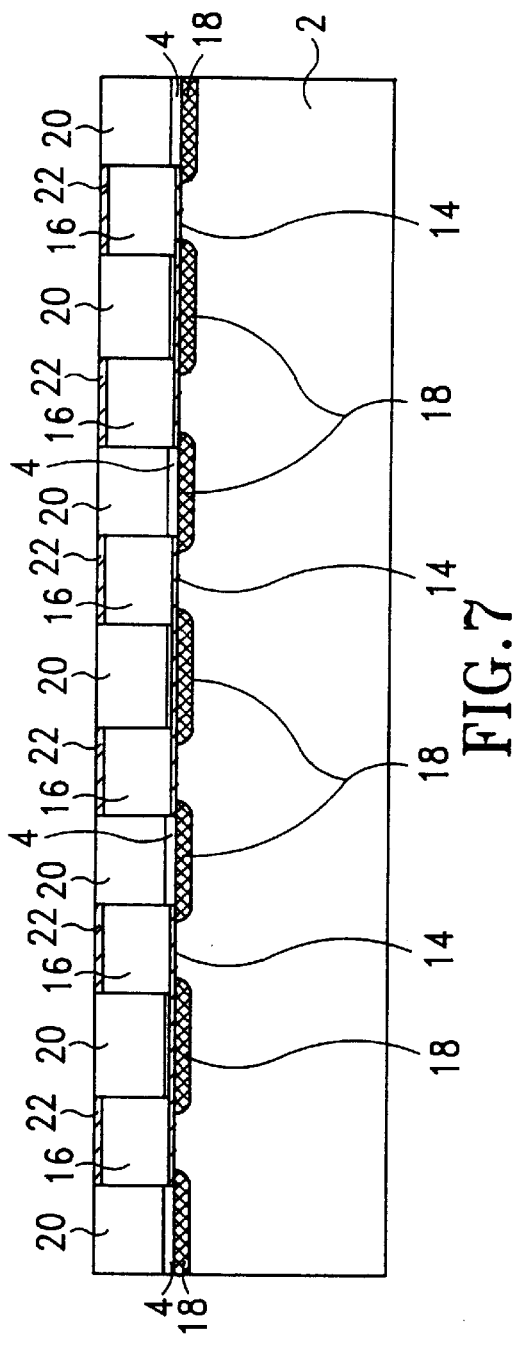
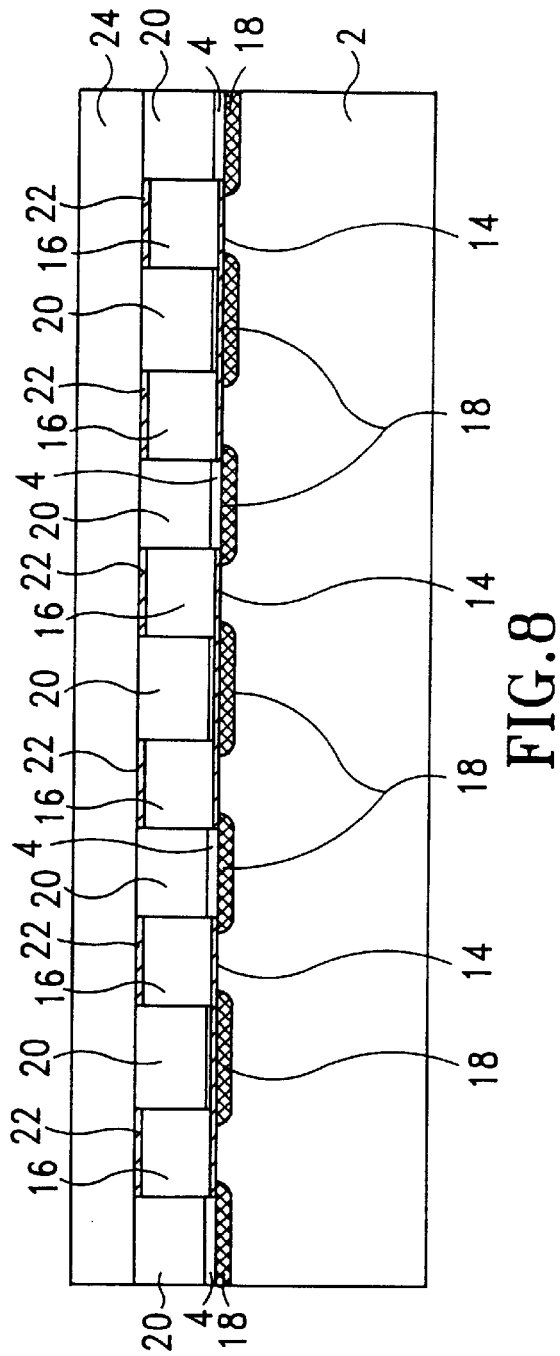

HIGH DENSITY NAND STRUCTURE NONVOLATILE MEMORIES

The present invention relates to a semiconductor device, and more specifically, to a structure of nonvolatile memories.

BACKGROUND OF THE INVENTION

The semiconductor industry has advanced in the field of Ultra Large Scale Integrated (ULSI) technologies. The fabrication of the nonvolatile memories also follows the trend of the reduction of the size of a device. The nonvolatile memories include various types of devices, such as EAROM (electrically alterable read only memory), EEPROM (electrically erasable programmable read only memory), flash EEPROM, non-volatile SRAMs and non-volatile DRAMs etc. Different types of devices have been developed for specific application requirements in each of these segments. These parts have been developed with a focus on the high endurance and high speed requirements.

The basic technologies used to manufacture electrically programmable ROMs all utilize some extent Fowler-Nordheim tunneling which is cold electron tunneling through the energy barrier at a silicon—silicon dioxide interface and into the oxide conduction band. The thin silicon dioxide layer allows charges to tunnel through when a voltage is applied to the gate. These charges are trapped in the silicon dioxide to silicon nitride interface and remain trapped there since the materials are high quality insulators.

Take the EEPROM as an example. In its programming mode, a negative voltage is applied to the source and drain while the substrate and gate are grounded. The potential at the central portion of the channel became almost the same as that of the drain and source so that tunneling electrons move from the silicon to the nitride through the thin oxide layer and the electrons are trapped in the nitride. In the mode of erasing, electrons are emitted from the traps in the nitride by applying a negative voltage to the gate electrode while the source and the drain are grounded.

Various nonvolatile memories have been disclosed in the prior art. For example, Mitchellx has proposed EPROMs with self-aligned planar array cell. In this technique, buried diffusion self-aligned to the floating gate avalanche injection MOS transistor are used for the bit lines. Cross point array technology has been disclosed. The self-aligned source and drain will allow this device to be optimized even further for programming speed. See "A New Self-Aligned Planar Cell for Ultra High Density EPROMs," A. T. Mitchellx, IEDM, Tech. pp. 548–553, 1987. Bergemont proposed another cell array for high density flash EEPROM, which can be seen in "NOR Virtual Ground (NVG)—A New Scaling Concept for Very High Density FLASH EEPROM and its Implemntation in a 0.5 μm Process," A. Bergemont, IEEE, pp. 15–18, 1993. This cell structure is introduced for scaling down the size of the devices to fabricate high density EEPROMs. In the flash array schematic, one metal bit line is shared between two columns of cells. The NVG array uses select devices at the top and bottom of each array block. The metal bit lines are connected through contacts to every other diffusion bit line. Other prior art that relates to the field is the article "A 0.67 um2 Self-Aligned Shallow Trench Isolation Cell (SA-STI CELL) for 3V-only 256 Mbit EEPROMs," S. Aritome, IEEE, pp. 61–64, 1994. Aritome proposed a NAND structure EEPROM that reduces the cell size without scaling of the device dimension.

Typically, the high density nonvolatile memories can be applied as the mass storage of portable handy terminals, solid state camera and PC cards. This is because nonvolatile memories exhibit many advantages, such as a fast access time, low power dissipation, and robustness. Further, it can be used to replace magnetic disk memory. However, it is difficult to make the sub-0.1 micron meter nonvolatile memory by using the current lithography technology.

SUMMARY OF THE INVENTION

The present invention includes a plurality of pad oxides that are formed on a substrate. A plurality of first isolations are formed on the pad oxides for isolation. The first isolations are separated from each other. A plurality of second isolations are formed on the substrate, adjacent to the pad oxides and between the pad oxides. A plurality of floating gates are formed on the second isolations and between the first isolations. A plurality of third isolations are formed at the top of the floating gates. A word line is formed on the first isolations and on the third isolations. A plurality of bit lines are formed in the substrate and under the first isolations.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 7 is a cross-sectional view of a semiconductor wafer illustrating the step of forming a second silicon oxynitride layer according to the present invention.

FIG. 8 is a cross-sectional view of a semiconductor wafer illustrating the step of forming a word line according to the present invention.

DETAILED DESCRIPTION OF THE PREFERRED EMBODIMENT

Figure 1:
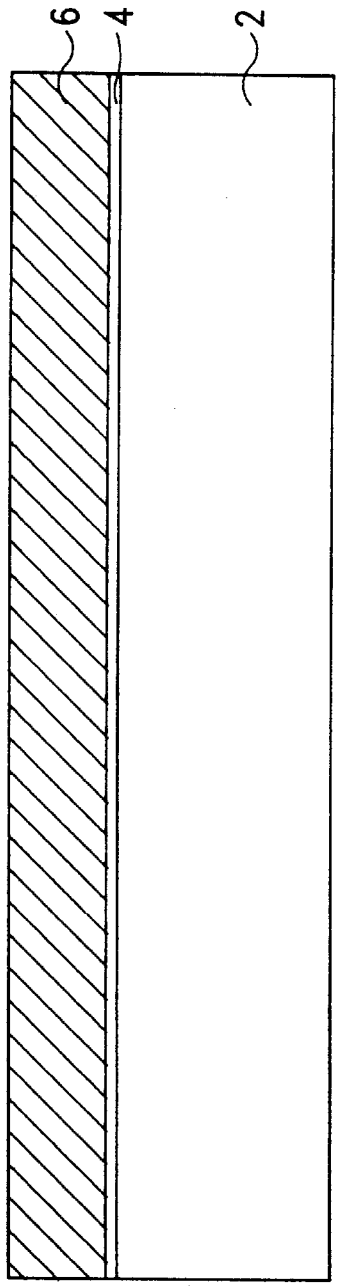
FIG. 1 is a cross-sectional view of a semiconductor wafer illustrating the steps of forming a pad oxide and silicon nitride layer on a semiconductor substrate according, to the present invention.

The present invention proposes a new structure of a high-density NAND-type nonvolatile memory cell. In the formation of this cell, polysilicon spacers will be used as an ion implantation mask. The array density of the devices can be significantly increased by using current lithography technology. Further, the proposed recipe is more simple than the prior art. The detailed description will be seen as follows.

Turning to FIG. 8, illustrates a structure of a NAND cell array for nonvolatile memories formed on a semiconductor substrate 2 is shown. A plurality of pad oxides 4 are formed on the substrate 2, each pad oxide 4 is separated to keep a space with respect to each other. A plurality of first isolations 20 are formed on each pad oxide 4 for isolation. The first isolations can be formed of oxide. The first isolations 20 are separated from each other. A plurality of second isolations 14 formed of silicon oxynitride are formed on the substrate 2, adjacent to the pad oxides 4 and between the pad oxides 4. A plurality of floating gates 16 are formed on the second isolations 14, between the first isolations 20 and adjacent to the first isolations 20. The floating gates 16 are preferably formed of polysilicon, TiN or Ta. A plurality of third isolations 22 are formed at the top of the floating gates 16 for insulating the floating gates 16. A word line 24 is formed on the first isolations 20 and on the third isolations 22. A plurality of bit lines 18 are formed in the substrate 2 and under the first isolations 20. The bit lines 18 are preferably formed of doped impurities regions by ion implantation, such as source and drain regions.

The formation of the present invention can be seen as follows. In a preferred embodiment, as shown in the FIG. 1, a single crystal silicon substrate 2 with a <100> crystallographic orientation is provided. A pad oxide layer 4 consisting of silicon oxide is formed on the substrate 2 to act as a cushion between the silicon substrate 2 and subsequent silicon nitride layer 6 for reducing the stress between them. Typically, the pad oxide 4 can be grown in an oxygen ambient in a furnace at a temperature of about 800 to 1100 degrees centigrade. Other methods, such as chemical vapor deposition, can be used to form the pad oxide 4. Then, a silicon nitride layer 6 is deposited on the pad oxide 4.

Figure 2:
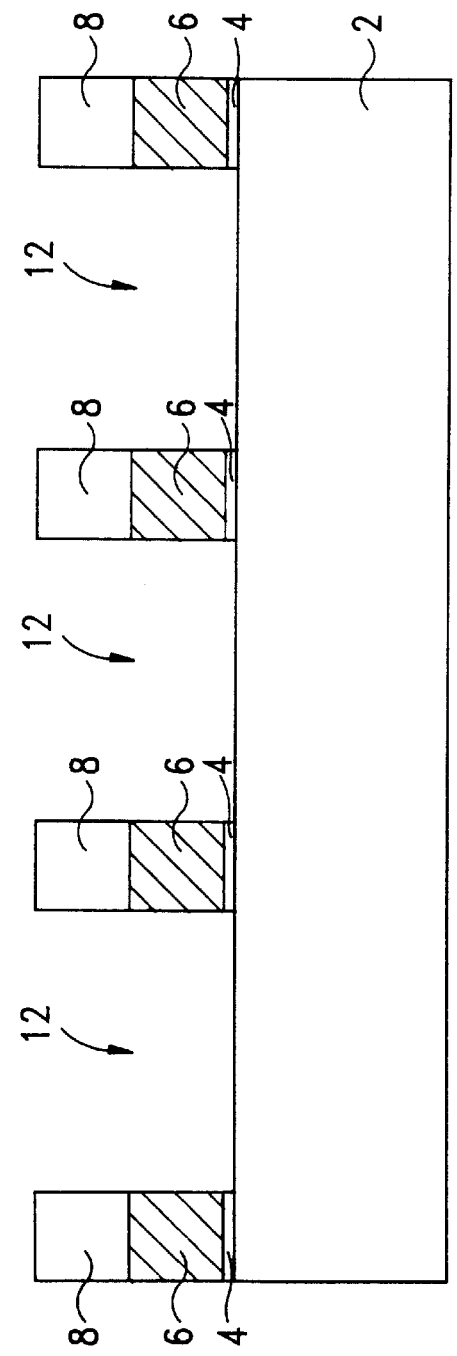
FIG. 2 is a cross-sectional view of a semiconductor wafer illustrating the step of etching the pad oxide and the silicon nitride layer according to the present invention.

Turning to FIG. 2, a photoresist 8 having openings 10 is patterned on the silicon nitride layer 6 using a lithography process to expose portions of the silicon nitride layer 6. Then, an etching process is used to etch the silicon nitride layer 6 and the pad oxide 4 by using the photoresist 8 as an etching mask for defining the silicon nitride pattern 6. Thus, portions of the substrate 2 are exposed by this step. In the preferred embodiment, the photoresist 8 includes a plurality of individual portions separated from each other. The widths of the individual portions are about 300 to 3000 angstroms. The width of the openings 12 can range from 500 to 5000 angstroms. After the silicon nitride pattern is defined, the photoresist 8 is removed.

Figure 3:
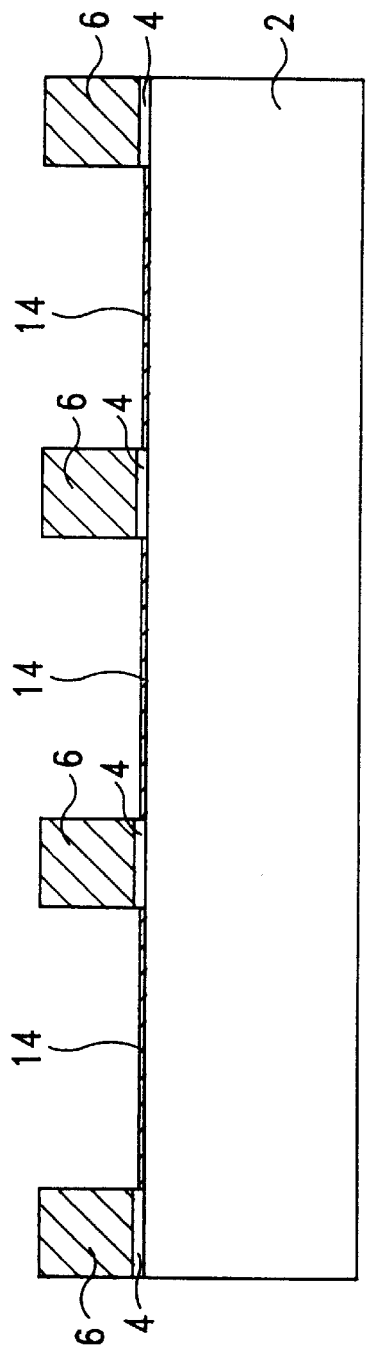
FIG. 3 is a cross-sectional view of a semiconductor wafer illustrating the step of forming silicon oxynitride layer according to the present invention.

Subsequently, an ultra thin dielectric layer, such as silicon oxynitride layer 14, is formed on the substrate 2 and is exposed by the silicon nitride pattern 6, adjacent to the pad oxide 4, as shown in FIG. 3. The silicon oxynitride layer 14 is formed by thermal oxidation in either a $N_2O$ or a NO environment. The temperature for forming the silicon oxynitride layer 14 ranges from 700 to 1150 degrees centigrade. The thickness is preferably about 15 to 150 angstroms.

Figure 4:
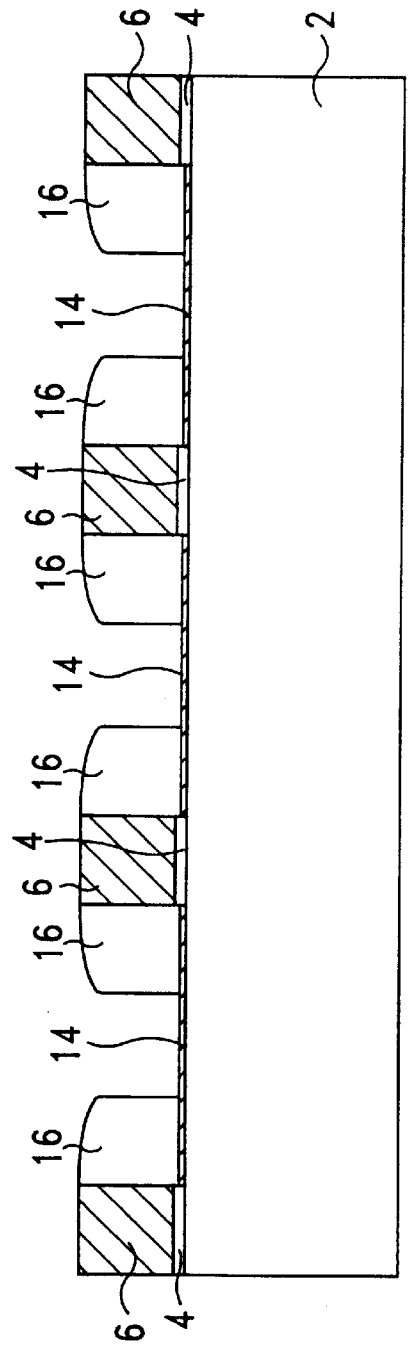
FIG. 4 is a cross-sectional view of a semiconductor wafer illustrating the step of forming polysilicon side wall spacers according to the present invention.

Turning to FIG. 4, polysilicon side wall spacers 16 are formed on the side walls of the silicon nitride pattern 6. Further, TiN or Ta can replace the polysilicon as the side wall spacers 16. In order to achieve this, an undoped polysilicon layer 16 is deposited along the surface of the silicon nitride pattern 6 and on the silicon oxynitride layer 14 to a thickness about 200 to 3000 angstroms. Subsequently, an anisotropical etching is performed to etch the polysilicon layer 16, thereby forming the side wall spacers 16. The width of the side wall spacers 16 depends on the thickness of the undoped polysilicon layer 16. The polysilicon side wall spacers 16 will be used as floating gates later. Thus, the use of the thickness of the polysilicon layer 16 can control the size of the gates. A first portion of the silicon oxynitride layer 14 is exposed by the side wall spacers 16, a second portion of the silicon oxynitride layer 14 remains under the side wall spacers 16.

Figure 5:
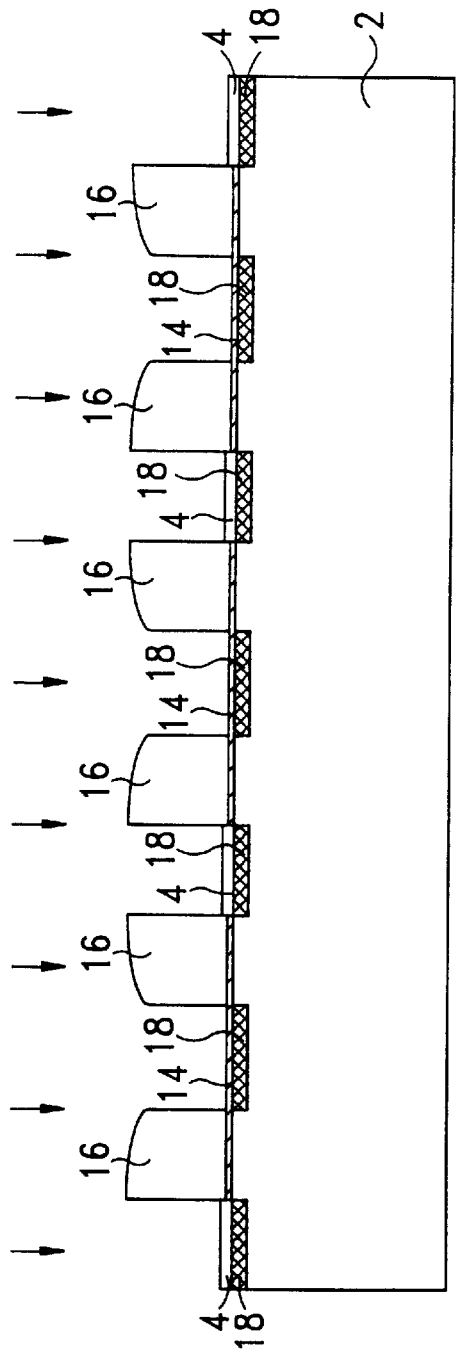
FIG. 5 is a cross-sectional view of a semiconductor wafer illustrating the steps of removing the silicon nitride layer and performing an ion implantation according to the present invention.

Turning to FIG. 5, the following step is to remove the silicon nitride pattern 6 to leave the side wall spacers 16 remaining over the substrate 2. Thus, the pad oxide 4 is exposed by the stripping step. In the embodiment, the silicon nitride can be removed by using hot phosphorus acid solution. Then, a blanket ion implantation is carried out to implant dopant into the side wall spacers 16, and through the pad oxide 4 or the silicon oxynitride layer 14 into the substrate 2. The dosage and the ion implantation energy of the step are respectively about 1E14 to 1E16 atoms/cm$^2$, about 1 to 60 KeV. As can be seen in the FIG. 5, the source and drain 18 are formed under this ion implantation. Further, the polysilicon side wall spacers 16 are used as floating gates of devices.

Figure 6:
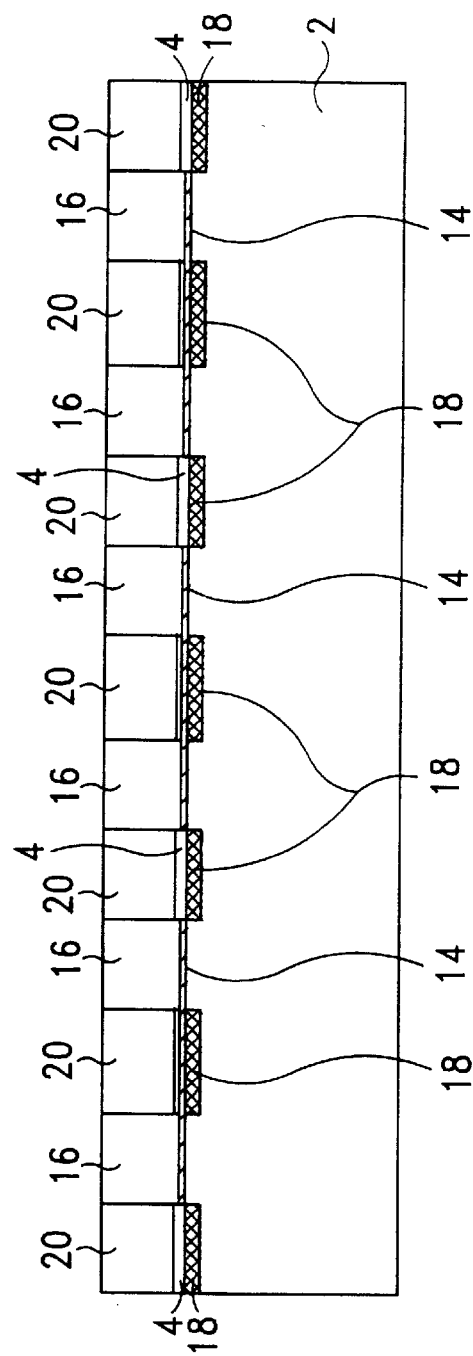
FIG. 6 is a cross-sectional view of a semiconductor wafer illustrating the steps of forming an oxide and performing a planarization according to the present invention.

As shown in FIG. 6, a thick oxide layer 20 is deposited on the gates 16 and filled between the gates 16 by using chemical vapor deposition. Then, a chemical mechanical polishing (CMP) is performed to remove a portion of the oxide layer 20, and the floating gates 16. A planar topography is achieved by using the well known technology.

Referring to FIG. 7, a further silicon oxynitride layer 22 is grown at the top of the floating gates 16 for isolation. Similarly, this is achieved by thermal oxidation in either a $N_2O$ or a NO environment at a temperature of about 700 to 1150 degrees centigrade.

Next, as can be seen by reference to FIG. 8, a conductive layer, such as doped polysilicon layer 24, is formed on the oxide 20, floating gates 16 as word line. The doped polysilicon layer 24 can be chosen from doped polysilicon or in-situ doped polysilicon. The type of the dopant can be n+ conductive type. In addition, the metal or alloy layer can be used as the conductive layer.

Figure 9:
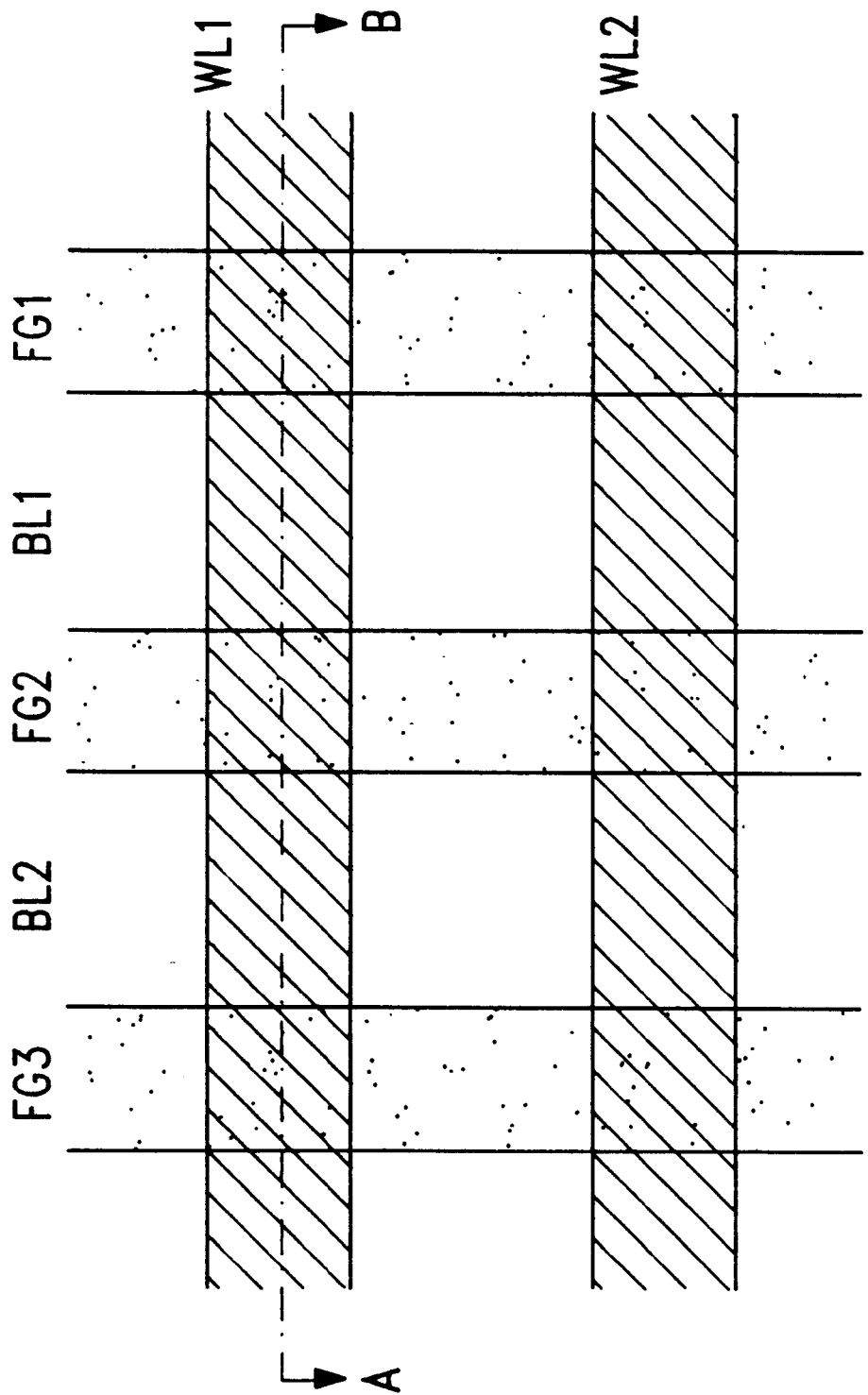
FIG. 9 is a nonvolatile memory array schematic according to the present invention.

FIG. 9 is a nonvolatile memory array schematic according to the present invention. (FIG. 8 is a cross-section view taken from the A-B line of FIG. 9.) In FIG. 9, a plurality of vertical lines used as floating gates (FG1, FG2, FG3, . . . ) are configured over a substrate. The bit lines (BL1, BL2, BL3, . . . ) are arranged between two columns of floating gates. Each bit line is shared between two floating gates. Word lines (WL1, WL2, . . . ) are cross over the floating gates, respectively.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A structure of a NAND cell array for nonvolatile memories formed on a substrate, said structure comprising:

a plurality of pad oxides formed on said substrate, each of said plurality of pad oxides being separated to keep a space with each other;

a plurality of first isolations formed on said plurality of pad oxides for isolation, said plurality of first isolations being separated from each other;

a plurality of second isolations formed on said substrate, adjacent to said plurality of pad oxides and between said plurality of pad oxides;

a plurality of floating gates formed on said plurality of second isolations, between said plurality of first isolations and adjacent to said plurality of first isolations;

a plurality of third isolations formed at a top of said plurality of floating gates for isolation;

a word line formed on said plurality of first isolations and on said plurality of third isolations; and a plurality of bit lines formed in said substrate and under said plurality of first isolations.

2. The structure of claim 1, wherein said plurality of first isolations comprise oxides.

3. The structure of claim 1, wherein said plurality of second isolations comprise silicon oxynitrides.

4. The structure of claim 3, wherein said plurality of second isolations are formed by oxidation in an $N_2O$ ambient.

5. The structure of claim 3, wherein said plurality of second isolations are formed by oxidation in an NO ambient.

6. The structure of claim 3, wherein said plurality of second isolations are formed at a temperature about 700 to 1150 degrees centigrade.

7. The structure of claim 1, wherein said plurality of third isolations comprise silicon oxynitrides.

8. The structure of claim 7, wherein said plurality of third isolations are formed by oxidation in an $N_2O$ ambient.

9. The structure of claim 7, wherein said plurality of third isolations are formed by oxidation in an NO ambient.

10. The structure of claim 7, wherein said plurality of third isolations are formed at a temperature about 700 to 1150 degrees centigrade.

11. The structure of claim 1, wherein said plurality of floating gates are formed of polysilicon.

12. The structure of claim 1, wherein said plurality of floating gates are formed of TiN.

13. The structure of claim 1, wherein said plurality of floating gates are formed of Ta.

14. The structure of claim 1, wherein said word line is formed of a conductive material.

15. The structure of claim 14, wherein said word line is formed of polysilicon.

16. The structure of claim 14, wherein said word line is formed of metal.

17. The structure of claim 14, wherein said word line is formed of alloy.

18. The structure of claim 1, wherein said plurality of bit lines comprises conductive type dopants.

19. The structure of claim 18, wherein the dosage of said conductive type dopants is about 1E14 to 1E16 atoms/cm$^2$.

20. The structure of claim 18, wherein the energy to form said conductive type dopants is about 1 to 60 KeV.

* * * * *